(12) United States Patent
Stuve

(10) Patent No.: US 7,977,935 B2
(45) Date of Patent: Jul. 12, 2011

(54) TEMPERATURE TOLERANT MAGNETIC LINEAR DISPLACEMENT SENSOR

(75) Inventor: Steven R Stuve, Lake Mills, WI (US)

(73) Assignee: Key Safety Systems, Inc., Sterling Heights, MI (US)

( * ) Notice: Subject to any disclaimer, the term of this patent is extended or adjusted under 35 U.S.C. 154(b) by 219 days.

(21) Appl. No.: 12/477,988

(22) Filed: Jun. 4, 2009

(65) Prior Publication Data
US 2010/0308805 A1 Dec. 9, 2010

(51) Int. Cl.
*G01B 7/14* (2006.01)
(52) U.S. Cl. ............ 324/207.24; 324/207.2; 324/207.21
(58) Field of Classification Search ............. 324/207.24, 324/207.21, 207.2; 338/32 R, 32 H
See application file for complete search history.

(56) References Cited

U.S. PATENT DOCUMENTS

| | | |
|---|---|---|
| 4,039,936 A | 8/1977 | Jones et al. |
| 4,875,008 A | 10/1989 | Lorenzen |
| 4,926,122 A | 5/1990 | Schroeder et al. |
| 4,939,456 A | 7/1990 | Morelli et al. |
| 5,159,268 A | 10/1992 | Wu |
| 5,359,287 A | 10/1994 | Watanabe et al. |
| 5,450,009 A | 9/1995 | Murakami |
| 5,477,143 A | 12/1995 | Wu |
| 5,642,043 A | 6/1997 | Ko et al. |
| 5,656,936 A | 8/1997 | Ao et al. |
| 5,814,985 A | 9/1998 | Oudet |
| 6,064,198 A | 5/2000 | Wolf et al. |
| 6,194,893 B1 | 2/2001 | Yokotani et al. |
| 6,218,829 B1 | 4/2001 | Wittenstein et al. |
| 6,232,770 B1 | 5/2001 | Schroeder |
| 6,246,234 B1 | 6/2001 | Yokotani et al. |
| 6,515,474 B1 | 2/2003 | Dielschneider et al. |
| 7,088,095 B1 | 8/2006 | Busch |
| 7,378,838 B2 | 5/2008 | Mizutani et al. |
| 2006/0061353 A1 | 3/2006 | Etherington et al. |
| 2007/0096723 A1 | 5/2007 | Rieger et al. |
| 2007/0103343 A1 | 5/2007 | Recio et al. |
| 2008/0106259 A1 | 5/2008 | Stuve |

FOREIGN PATENT DOCUMENTS

| | | |
|---|---|---|
| WO | 9510020 A1 | 4/1995 |
| WO | 0221080 A1 | 3/2002 |

*Primary Examiner* — Reena Aurora
(74) *Attorney, Agent, or Firm* — Markell Seitzman; Lonnie R. Drayer

(57) ABSTRACT

A linear motion sensor has two pairs of opposed spaced apart stacks of two simple two-pole bar magnets. Each stack has one shorter outer magnet and one longer inner magnet, with the outer magnets centered on the inner magnets. The poles of the magnets are oriented the same in each pair, but opposite with respect to the other pair. The shape of the magnets results in the magnetic fields produced by each pair of magnets being substantially outside of the magnets themselves, so that the load line for the combined magnets is above the knee in its B/H material demagnetization curve. The pairs of magnets define a gap therebetween in which a magnetic field sensor is mounted for travel. The shorter magnets are about one half the length of the longer magnets such that the magnetic field in the gap varies substantially linearly as the sensor moves along the gap.

20 Claims, 3 Drawing Sheets

TEMPERATURE TOLERANT MAGNETIC LINEAR DISPLACEMENT SENSOR

BACKGROUND OF THE INVENTION

The present invention relates generally to position measurement devices in general and more particularly to devices used to sense linear motion using magnetic fields.

It is often necessary to measure the position or displacement of two elements relative to each other. This displacement can be measured with many different sensing technologies over a large range of accuracies, with different levels of complexity, and at a wide range of costs.

Some common apparatus for measuring linear displacement employ linear encoders, capacitive sensors, eddy current sensors, a linear variable differential transformer, photoelectric or fiber optic sensors, or magnetic field sensors. Linear encoders use a glass or metal ruler that is made of a high stability material so that changes in temperature do not affect measurement accuracy. These materials, such as quartz, steel, Invar® alloy, glass or ceramics generally require special machining techniques to manufacture and thus are more expensive.

Capacitive sensors are used with both conductive and non-conductive target materials but are very sensitive to environmental variables that change the dielectric constant of the medium between the sensor and the target, usually air. Eddy current sensors contain two coils: an active coil that indicates the presence of a conducting target, and a secondary coil that completes a bridge circuit. A linear variable differential transformer (LVDT) sensor has a series of inductors in a hollow cylindrical shaft and a solid cylindrical core. The LVDT produces an electrical output that is proportional to the displacement of the core along the shaft. The size and mounting of these coils or cores and the sensitivity of measurement are competing design factors in the use of eddy current or LVDT sensors.

Photoelectric and fiber optic sensors use beams of light to measure distance or displacement. The photoelectric sensor uses free-space transmission of light while the fiber optic sensor uses a pair of adjacent fibers to carry light to a target and receive reflected light from the object. Alignment of the fibers and the complexity of the optics needed to maintain the light path are difficulties in using this technology.

Magnetic sensors such as the Hall effect sensor, GMR sensor, or an AMR sensor can be used with a linear array of teeth or alternating magnetic poles to produce a sinusoidal output indicative of the sensor's linear motion. However, the initial position must be determined and each tooth or magnetic pole must be counted and phase data analyzed for greatest accuracy.

A sensor which outputs voltage which is directly proportional to linear position has the advantage that it may be turned on and may produce an accurate determination of position without calibration or reset. One such sensor uses a pair of magnets with convex surfaces of the same magnetic pole facing each other. However, this type of sensor requires forming a nonlinear curve on the faces of the magnets which, depending on the magnetic material used, can be costly. My own earlier invention U.S. Pat. No. 7,521,922 uses stepped magnets to produce a substantially linear varying magnetic field. However sensors with longer linear fields, and resistant to a wide range of temperatures are desirable.

What is needed is a magnetic linear displacement sensor which produces direct correspondence between position and magnetic field strength that can be constructed with a simple magnet geometry and which can operate at higher temperatures.

SUMMARY OF THE INVENTION

The linear motion sensor of this invention comprises two substantially identical pairs of simple stacked dipole magnets arranged as mirror images across a gap. Each stack of two magnets comprises an outer shorter magnet and an inner longer magnet, wherein each magnet is a simple two pole bar magnet, and the smaller outer magnets are centered on the respective inner larger magnets. The poles of the smaller outer and larger inner magnets are oriented the same in each pair, and opposite with respect to the opposed pair of magnets. The shape of the magnets results in the magnetic fields produced by each pair of magnets being substantially outside of the magnets themselves, so that the load line (also called the permeance coefficient) for the combined magnets is above the knee in its B/H material demagnetization curve. For example 3 or more for typical rare earth or ferrite materials. The pairs of spaced apart opposed magnets define a gap therebetween, so that a magnetic field sensor such as a Hall effect sensor may be moved axially in the gap along the magnets and experience a substantially linear change in magnetic field. Only a single magnet pair is required to form the substantially linearly changing magnetic field, but the second pair of magnets decreases the sensitivity with respect to small displacements in the gap perpendicular to the magnet pairs.

It is a feature of the present invention to provide a linear magnetic sensor which is less sensitive to demagnetization at high temperatures.

It is another feature of the present invention to provide an array of magnets which are simple in shape and simple to fabricate.

It is a further feature of the present invention to provide a linear magnetic sensor where the magnetic field itself changes linearly along the path of the sensor.

Further features and advantages of the invention will be apparent from the following detailed description when taken in conjunction with the accompanying drawings.

DESCRIPTION OF THE PREFERRED EMBODIMENTS

Figure 1:
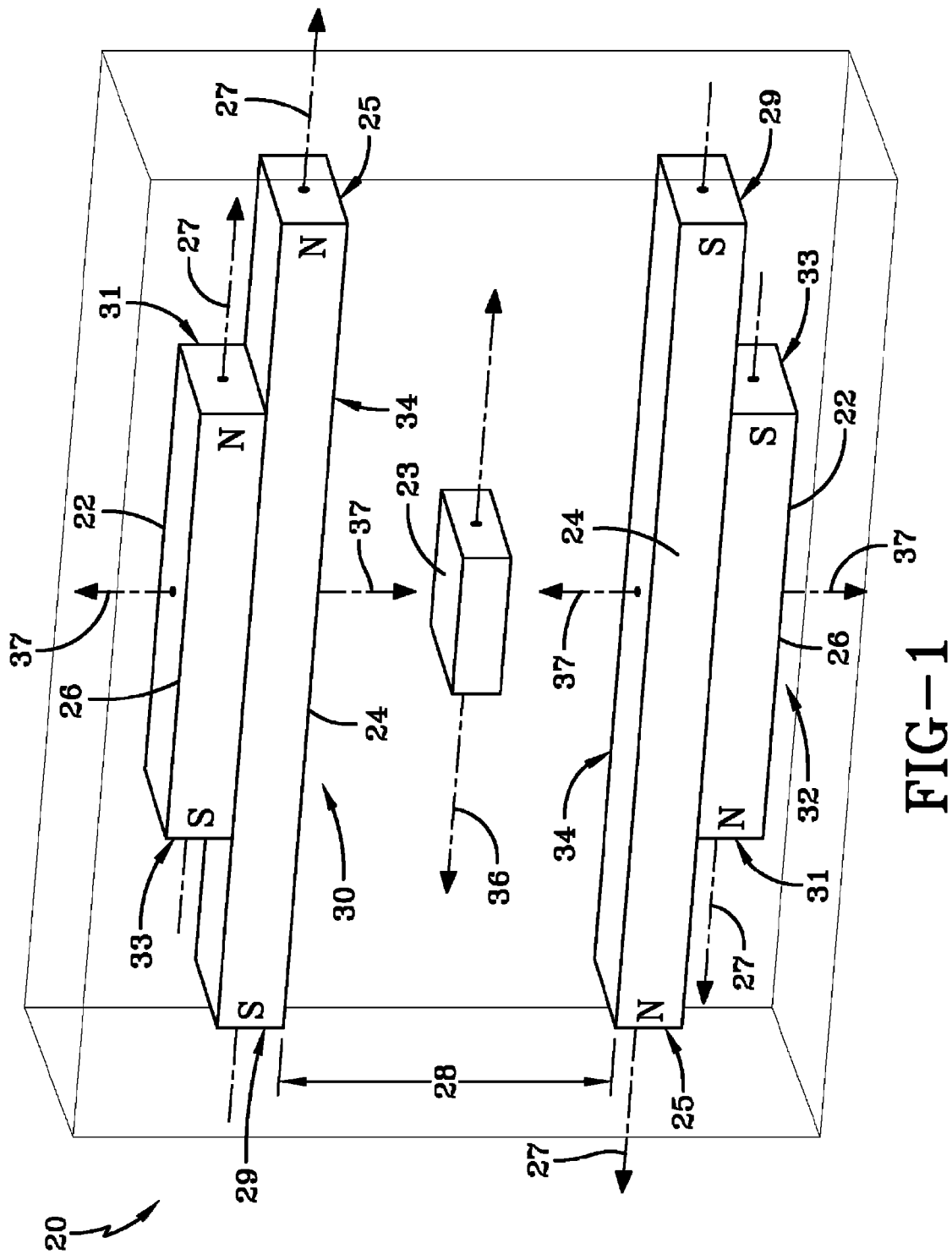
FIG. 1 is an isometric schematic view of the linear magnetic sensor of this invention.
Figure 2:
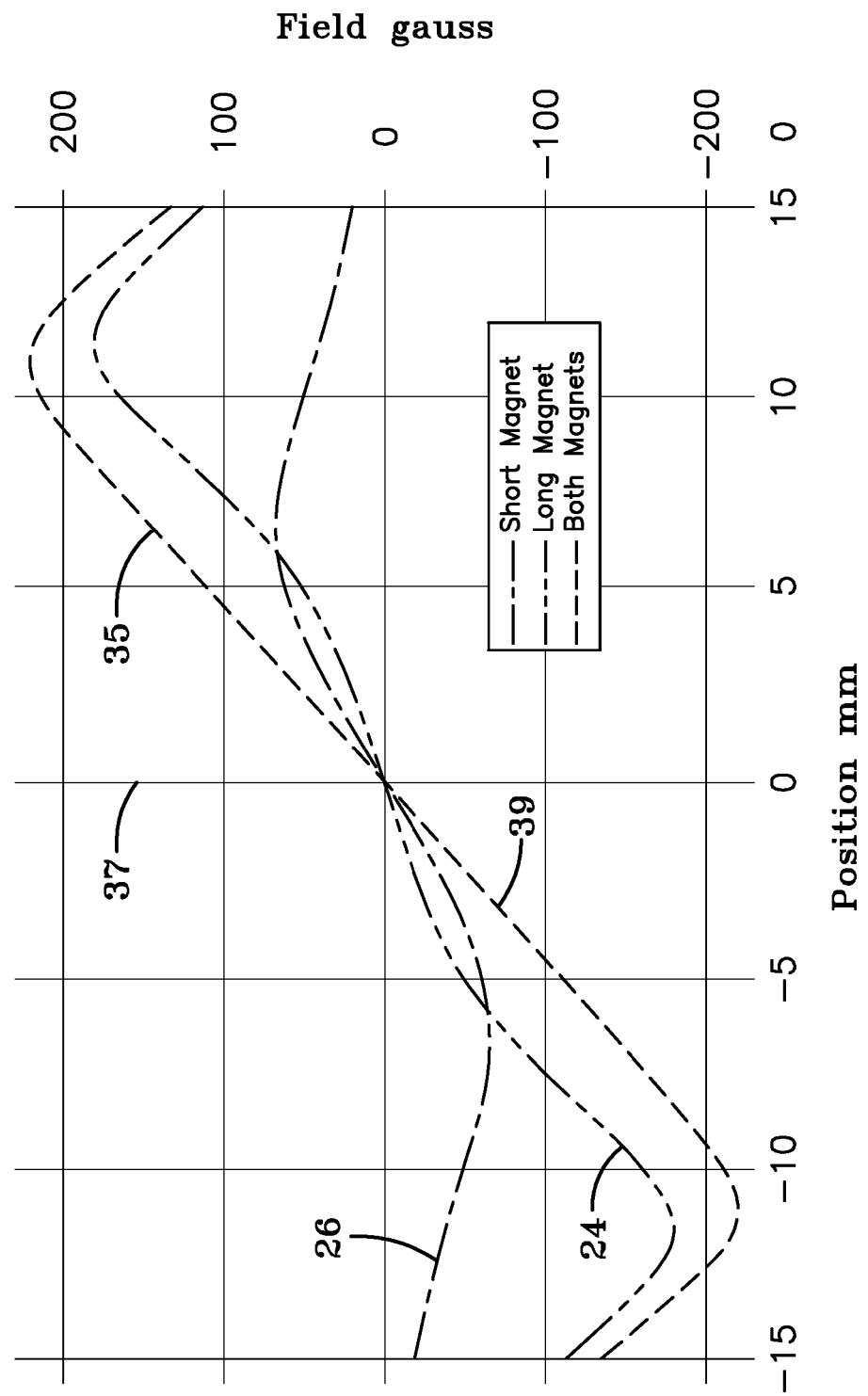
FIG. 2 is a graphical view of the magnetic field strength along the axis of the sensor of FIG. 1, showing the magnetic fields of each magnetic component and their sum.
Figure 3:
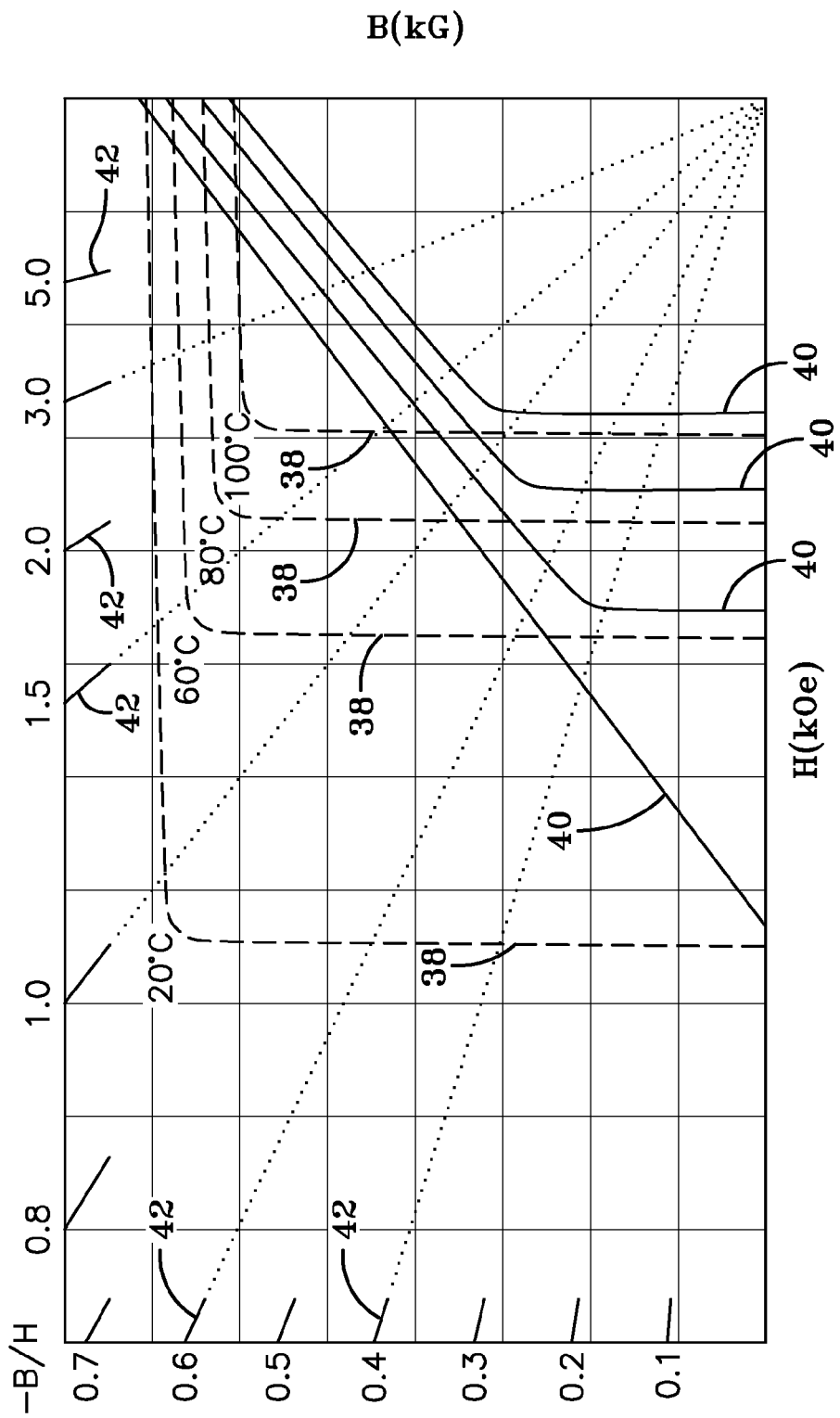
FIG. 3 is a schematic graphical view of the demagnetization curve representative of a rare earth magnet.

Referring more particularly to FIGS. 1-3, wherein like numbers refer to similar parts, a magnetic linear position sensor 20 is shown in FIG. 1. The sensor 20 is constructed from two pairs 22 of opposed magnets, and a magnetic field sensor 23. Each magnet pair 22 is a stack formed from a long magnet 24 approximately 23 mm long and a short magnet 26 approximately 12.2 mm long and centered on the long magnet. As shown in FIG. 1, the long magnets 24 face each other to define a gap 28 which is between the magnetic pairs 22. Each long magnet 24 and each short magnet 26 is a simple bar magnet having one north pole N and one south pole S. Each long magnet 24 extends between a north end 25 and a south end 29. Similarly each short magnet 26 extends between a north end 31 and a south end 33. The upper pair of magnets 30 is arranged with the poles oriented S-N, and the lower pair of magnets 32 is arranged with the poles oriented N-S such that there is an attractive force between the magnet pairs. Each magnet, 24, 26 has a magnetic axis 27, defined as the line through the center of the magnet such that an applied magnetic field in the direction of the axis will exert a zero torque on the magnet. The direction of the arrows 27 in FIG. 1 indicate the direction of the north poles. The short magnets 26 are right rectangular prisms 12.2 mm long, 1.9 mm high, and 4.5 mm in depth. The long magnets 24 also are right rectangular prisms 23 mm long, 2.4 mm high, and 4.5 mm in depth. The gap 28 is 9.3 mm in height i.e. perpendicular to the inward facing surfaces 34 of the long magnets 24.

The short magnet 26 and the long magnet 24 are arranged symmetrically as shown in FIG. 1 with the short magnet centered on the long magnet, so that the north end 25 of the long magnet, and the south end 29 of the long magnet are equally spaced from the corresponding north end 31 and south end 33 of the short magnet. In this way the magnetic fields generated by the long 24 and short magnets 26 together, are symmetrical in magnitude about the centerline 37 of the magnetic pair 22 and are opposite in magnetic polarity. In other words the magnetic fields produced by the magnetic pair 22 are rotated 180° about the centerline 37 of the magnetic pair.

As shown in FIG. 2, the summation 35 of the magnetic field strength of the short magnets 26 and the long magnets 24 produces a field which varies substantially linearly along an axis 36, so that magnetic a field sensor 23 such as a Hall-effect sensor detects a nearly constantly varying magnetic field as the sensor is moved with respect to the magnetic pairs 22 along the axis 36 as illustrated in FIG. 1. The axis 36 is represented by the abscissa or X axis of FIG. 2. As shown in FIG. 2 the linear portion 39 of the total magnetic field 35 is substantially the same as the length of the long magnets 24 as said length is projected perpendicularly onto the axis 36, e.g. for long magnets which are 23 mm long, the linear portion 39 of the total magnetic field is also approximately 23 mm long.

While it is not strictly necessary to utilize two pairs 22 of magnets, utilizing two pairs of magnets makes the sensor 20 substantially insensitive to small offsets of axis 36 with respect to the gap facing surfaces 34 of the long magnets 24. The sensor 20 is insensitive to the axis 36 being displaced towards one of the gap facing surfaces 34, because the stronger force of one magnetic pair, which is now closer, is offset by the weaker force from the magnetic pair which is now further away. Axial misalignment of the axis 36 so that the axis converges to a small degree with the gap facing surfaces produces only a small error because axial misalignment takes advantage of both the compensating effect of displacement described above, but also the small angle affect.

In the design of the linear position Sensor 20 the linear portion of the magnetic field between the magnet pairs 22 is substantially equal to the length of the longer magnets 24. The shorter magnet 26 of the magnetic pair 22 will generally be between ¾ and ¼ the length of the longer magnets 24, and variations in length and thickness of the shorter magnet can be used as free variables to linearize the magnetic field strength along the sensor axis 36.

The sensor 20 may particularly advantageously be used in an engine environment, for example, to sense the position of an engine exhaust valve. The magnetic sensor 20 can be constructed from a variety of magnets, for example rare earth magnets which have the necessary field strength and can cost-effectively be made in the simple shapes required by the sensor 20. However, rare earth magnets not only decrease in field strength at higher temperatures but are more easily irreversibly demagnetized at higher temperatures. The major source of demagnetization at higher temperatures (below the Curie point) is the self-demagnetization field of the sensor magnets themselves. The shapes of the magnets in this design reduce the self-demagnetization field to reduce irreversible demagnetization of the magnets in this design.

FIG. 3 shows a schematic demagnetization graph for a rare earth magnet. The demagnetization graph shows the graph of the hysteresis curve in the second quadrant for a particular type of magnet. The vertical axis is B or magnetic field strength measured in gauss, and the horizontal axis is the reversing or demagnetization field strength measured in oersted. The demagnetization curves 38 labeled with temperatures show the magnetic field strength of the magnet as a reversing field is increased. The second curves 40 show the sum of the magnetic field of the magnet minus reversing field and the third lines 42, referred to as the load lines, extend between the origin of the graph and −B/H numbers representing permeance coefficients, or a shape dependent coefficient. As a general rule as long as the magnet is operated in the linear region of the lines 40, no demagnetization takes place, and the portions of the lines 40 which lie to the right of the load lines 42 are the relevant portions of the lines 40. The load lines 42, which indicate magnetic shapes where the self-induced magnetic fields lie more or less outside the magnet, give an indication that better shaped magnets are less sensitive to higher temperatures. The magnets in the position sensor 20, because of their simple shape produce magnetic fields which are substantially outside the physical magnets. The shape of the magnet pairs 22 thus produces a load line 42 such that the magnets do not suffer demagnetization.

Ferrite magnets are another cost-effective magnet with good resistance to demagnetization, but which has demagnetization curves in which, as in rare earth magnets, the magnetic field strength decreases with temperature, but unlike rare earth magnets in which resistance to demagnetization increases with higher temperatures. However at low temperatures ferrite magnets are less resistant to demagnetization. A sensor such as an engine temperature sensor is subjected to both high temperatures due to operating conditions, and low temperatures due to external environmental conditions. So the same design logic for selecting magnetic shape to achieve a better load line for greater resistance to demagnetization is beneficial for ferrite magnets at low temperatures where they are most subject to demagnetization.

Magnetic sensor design, especially for use in the automotive industry is driven by cost considerations and for cost reasons the sensor 20 is probably most effective where a linear movement of between about 0.5 and 1.5 inches is measured. At smaller scale a single magnet device may be more cost-effective, and at a larger scale other technologies may be more cost-effective. Nevertheless, the magnetic sensor 20 is inherently scalable over a relatively large range.

For simplicity and cost reasons the short and long magnets 26, 24 may be manufactured separately and combined i.e., stacked, with adhesives or by being held in place by the sensor structure. Alternatively, the magnet pairs 22 can be made as an integral unit which is magnetized to achieve the same magnetic field produced by joining two separate magnets. In such a unitary magnet the arrangement of the two dipoles remains that of one being stacked upon the other. The unitary magnet equivalent to one of the magnetic pairs 22 may be described as "hat shaped," with the brim corresponding to the long magnet 24 and the upper portion or stovepipe of the hat corresponding to the shorter magnet 26. The brim and the stovepipe of the hat shaped magnet each have impressed thereon a single magnetic dipole which is aligned and in the transverse direction across the brim, or through the stove pipe. The hat shaped magnets are positioned brim to brim with the gap between the brims where the magnetic field sensor 23 is moved parallel to the magnetic axes 27.

The magnetic field sensor 23 is preferably a Hall-effect sensor, which typically will have a limited need for onboard processing power to linearize the output, because the magnetic field in the gap 28 between the magnetic pairs 22 is already substantially linear. However other magnetic field sensors can be used, for example an anisotropic magnetoresistance (AMR) sensor, which like a Hall-effect sensor provides a true differential output of both sign and magnitude of a magnetic field. Sensors such as giant magnetoresistive (GMR) sensors which do not provide sign but only magnitude of the magnetic field and so are less advantageous but might be used in some circumstances.

It should be understood that the magnetic field sensor 23 may be fixedly mounted and the magnetic pairs 22 may be mounted for motion parallel to the axis 36, or alternatively the magnet pairs may be fixed and the magnetic field sensor 23 may be mounted for motion along the axis 36.

It should be understood that where structures are described as being substantially parallel, varying substantially linearly, substantially of the same magnitude, substantially identical shape, or substantially all of the measurement axis, the terms "substantially" or "about" is intended to include those variations in structure which while not identical, are sufficiently close to the described arrangement so that the functional relationship remains, and beneficial effect remains.

Rare earth magnets are magnets made from alloys of rare earth elements (lanthanides) which are elements with the incompletely filled F-shell, and include magnets such as those made from a Neodymium alloy ($Nd_2Fe_{14}B$) or samarium cobalt ($SmCo_5$). Ferrite magnets are a class of chemical compounds with the formula $AB_2O_4$ where A B represent various metal cations including iron, for example $ZnFe_2O_4$.

It is understood that the invention is not limited to the particular construction and arrangement of parts herein illustrated and described, but embraces all such modified forms thereof as come within the scope of the following claims.

The invention claimed is:

1. A linear position sensor comprising:
 a magnetic field strength sensor positioned substantially on a first axis;
 a first dipole magnet defining a first magnetic axis substantially parallel to the first axis, the first dipole magnet spaced from the first axis in a first direction and extending for a first length parallel to the first axis, and having a first north-south polarity;
 a second dipole magnet of the first polarity and fixed with respect to and closely spaced from or engaging the first dipole magnet, the second dipole magnet defining a second magnetic axis substantially parallel to the first axis and the first magnetic axis, the second dipole magnet spaced from the first axis in the first direction, and positioned between the first dipole magnet and the first axis, the second dipole magnet extending parallel to the first axis a second length which is between about ¼ to about ¾ that of the first length of the first dipole magnet, and extending symmetrically beyond the first dipole magnet along the first axis, so that the first dipole magnet and the second dipole magnet form a magnetic field which varies substantially linearly along a portion of the first axis on which a perpendicular projection of the second dipole magnet falls; and
 wherein the magnetic field strength sensor is mounted for movement relative to the first dipole magnet and the second dipole magnet.

2. The linear position sensor of claim 1 further comprising:
 a third dipole magnet defining a third magnetic axis substantially parallel to the first axis, the third dipole magnet spaced from the first axis in a second direction opposite the first direction and extending for the first length parallel to the first axis, the third dipole magnet arranged with a second north-south polarity which is opposite the first north-south polarity; and
 a fourth dipole magnet of the second polarity and fixed with respect to and closely spaced from or engaging the third dipole magnet, the second dipole magnet defining a fourth magnetic axis substantially parallel to the first axis and the third magnetic axis, the fourth dipole magnet spaced from the first axis in the second direction, and positioned between the third dipole magnet and the first axis, the fourth dipole magnet extending parallel to the first axis a second length, and extending symmetrically beyond the third dipole magnet along the first axis, so that the third dipole magnet and the fourth dipole magnet form a magnetic field which varies substantially linearly along the portion of the first axis and is opposite in polarity to the magnetic field produced by the first dipole magnet and the second dipole magnet.

3. The linear position sensor of claim 1 wherein the magnetic field sensor is of the type which measures field strength and field polarity.

4. The linear position sensor of claim 1 wherein the first dipole magnet and the second dipole magnet are rare earth magnets.

5. The linear position sensor of claim 1 wherein the first dipole magnet and the second dipole magnet are ferrite magnets.

6. The linear position sensor of claim 1 wherein the magnetic field which varies substantially linearly along the portion of the first axis, extends about one-half to 1½ inches along the portion of the first axis.

7. The linear position sensor of claim 1 wherein the first dipole magnet and the second dipole magnet are right rectangular prisms.

8. The linear position sensor of claim 1 wherein the first dipole magnet and the second dipole magnet are integrally formed as a single structure.

9. The linear position sensor of claim 1 wherein the second length of the second dipole magnet is about one half that of the first length of the first dipole magnet.

10. A linear position sensor comprising:
 a first dipole magnet with a first magnetic axis, extending a first length along the first magnetic axis, and having a first centerline perpendicular to the first magnetic axis;
 a second dipole magnet with a second magnetic axis, extending a second length along the second magnetic axis, and having a second centerline perpendicular to the second magnetic axis;
 wherein the second length is less than the first length;
 wherein the first dipole magnet and the second dipole magnet are stacked with the first and second centerlines aligned, and with the first dipole magnet on top of the second dipole magnet, so that the first magnetic axis, and the second magnetic axis are parallel and have the same north-south orientation;
 a third dipole magnet with a third magnetic axis, extending the second length along the third magnetic axis, and having a third centerline perpendicular to the third magnetic axis;

a fourth dipole magnet with a fourth magnetic axis, extending the first length along the fourth magnetic axis, and having a fourth centerline perpendicular to the fourth magnetic axis;

wherein the third dipole magnet and the fourth dipole magnet are stacked with the third and fourth centerlines aligned and with the third dipole magnet on top of the fourth dipole magnet, so that the first, the second, the third, and the fourth magnetic axes are parallel and lie in a single plane, and so that the first, the second, the third, and the fourth centerlines are aligned;

wherein the third magnetic axis and the fourth magnetic axis have the same north-south orientation, which is opposite the north-south orientation of the first magnetic axis and the second magnetic axis;

wherein the first dipole magnet and the second dipole magnet are spaced from the third dipole magnet and the fourth dipole magnet, with the first dipole magnet and the fourth dipole magnet opposite each other to define a gap therebetween;

wherein the first, the second, the third, and the fourth dipole magnets are fixed with respect to each other;

a magnetic field strength sensor mounted in the gap for motion relative to the first, the second, the third, and the fourth magnets along a measurement axis substantially parallel to the first, the second, the third, and the fourth axes;

wherein the first magnet and the fourth magnet generate magnetic fields of substantially the same magnitude;

wherein the second magnet and the third magnet generate magnetic fields of substantially the same magnitude; and wherein the magnetic fields of the first magnet and the fourth magnet are of a selected strength such that when added to the magnetic fields of the second magnet and the third magnet respectively, there is created a magnetic field in the gap which varies substantially linearly along the measurement axis.

11. The linear position sensor of claim 10 wherein the second length of the second dipole magnet is about ¼ to about ¾ of the first length of the first dipole magnet.

12. The linear position sensor of claim 10 wherein the second length of the second dipole magnet is about one half of the first length of the first dipole magnet.

13. The linear position sensor of claim 10 wherein the magnetic field sensor is of the type which measures field strength and field polarity.

14. The linear position sensor of claim 10 wherein the first, the second, the third, and the fourth dipole magnets are rare earth magnets.

15. The linear position sensor of claim 10 wherein the first, the second, the third, and the fourth dipole magnets are ferrite magnets.

16. The linear position sensor of claim 10 wherein the magnetic field which varies substantially linearly along the measurement axis, extends about one-half to 1½ inches along a portion of the measurement axis.

17. The linear position sensor of claim 10 wherein the first, the second, the third, and the fourth dipole magnets are right rectangular prisms.

18. The linear position sensor of claim 10 wherein the first dipole magnet and the second dipole magnet are integrally formed as a single structure.

19. A linear position sensor comprising:
two substantially identical hat shaped magnets having a larger dipole magnet forming a brim, and a smaller dipole magnet forming a stovepipe, the larger dipole magnet and the smaller dipole magnet having magnetic axes which are aligned and have the same north-south orientation;

wherein the two hat shaped magnets are arranged brim to brim across the gap, with the magnetic axes of each hat shaped magnet aligned in a common plane, with opposite north-south orientation;

a magnetic field strength sensor mounted in the gap for motion relative to the hat shaped magnets along a measurement axis substantially parallel to the magnetic axes;

wherein the smaller dipole magnets are selected such that a magnetic field created in the gap varies substantially linearly along substantially all of the measurement axis which is between the hat shaped magnets.

20. The linear position sensor of claim 19 wherein each smaller magnet has a length of about ¼ to about ¾ of a length defined by the larger magnet, and the smaller magnets and the larger magnets are right rectangular prisms and wherein each hat shaped magnet is composed of two separately formed magnets or is a single structure comprised of the larger dipole magnet integrally formed with the smaller dipole magnet.

* * * * *